United States Patent [19]

Schoenborn

[11] Patent Number: 5,413,966
[45] Date of Patent: May 9, 1995

[54] SHALLOW TRENCH ETCH

[75] Inventor: Philippe Schoenborn, San Jose, Calif.

[73] Assignee: LSI Logic Corporation, Milpitas, Calif.

[21] Appl. No.: 179,751

[22] Filed: Sep. 9, 1993

Related U.S. Application Data

[63] Continuation of Ser. No. 719,838, Jun. 24, 1991, abandoned, which is a continuation-in-part of Ser. No. 711,624, Jun. 6, 1991, Pat. No. 5,290,396, which is a continuation-in-part of Ser. No. 632,461, Dec. 20, 1990, Pat. No. 5,242,536.

[51] Int. Cl.$^6$ ............................................. H01L 21/302
[52] U.S. Cl. .................................. 437/225; 437/228; 437/233; 437/67; 437/72; 148/DIG. 50
[58] Field of Search ................ 437/238, 233, 225, 67, 437/72; 148/DIG. 50

[56] References Cited

U.S. PATENT DOCUMENTS

| | | | |
|---|---|---|---|
| Re. 32,207 | 7/1986 | Levinstein et al. | 427/85 |
| 3,479,237 | 4/1966 | Bergh et al. | 156/11 |
| 4,019,248 | 4/1977 | Black | 29/583 |
| 4,032,373 | 6/1977 | Koo | 148/175 |
| 4,038,110 | 7/1977 | Feng | 148/187 |
| 4,256,534 | 3/1981 | Levinstein et al. | 156/643 |
| 4,276,557 | 6/1981 | Levinstein et al. | 357/67 |
| 4,470,874 | 9/1984 | Bartush et al. | 156/643 |
| 4,473,598 | 9/1984 | Ephrath et al. | 427/86 |
| 4,484,979 | 11/1984 | Stocker | 156/643 |
| 4,490,209 | 12/1984 | Hartman | 156/643 |
| 4,493,142 | 1/1985 | Hwang | 29/575 |
| 4,508,815 | 4/1985 | Ackmann et al. | 430/314 |
| 4,520,041 | 5/1985 | Aoyama et al. | 427/88 |
| 4,541,168 | 9/1985 | Galie et al. | 29/579 |
| 4,545,852 | 10/1985 | Barton | 156/643 |
| 4,609,809 | 9/1986 | Yamaguchi et al. | 219/121 |
| 4,666,553 | 5/1987 | Blumenfeld et al. | 156/643 |
| 4,671,851 | 6/1987 | Beyer et al. | 156/645 |
| 4,708,770 | 11/1987 | Pasch | 156/662 |
| 4,758,306 | 7/1988 | Cronin et al. | 156/643 |
| 4,775,550 | 10/1988 | Chu et al. | 427/38 |
| 4,789,648 | 12/1988 | Chow et al. | 437/225 |
| 4,791,073 | 12/1988 | Nagy et al. | 437/67 |
| 4,793,895 | 12/1988 | Kaanta et al. | 156/627 |
| 4,851,097 | 7/1989 | Hattori et al. | 204/192.33 |
| 4,876,217 | 10/1989 | Zdebel | 437/67 |
| 4,876,223 | 10/1989 | Yoda et al. | 437/228 |

(List continued on next page.)

FOREIGN PATENT DOCUMENTS

| | | |
|---|---|---|
| 0113517A2 | 7/1984 | European Pat. Off. |
| 0223920 | 6/1987 | European Pat. Off. |
| 0224013 | 6/1987 | European Pat. Off. |

(List continued on next page.)

OTHER PUBLICATIONS

English translation of the Japanese Kokai No. 62-120028.

(List continued on next page.)

Primary Examiner—Brian E. Hearn
Assistant Examiner—Trung Dang
Attorney, Agent, or Firm—Hickman & Beyer

[57] ABSTRACT

A trench mask is formed of two dissimilar layers of material deposited over a substrate. The lower of the two layers is an insulating layer such as silicon dioxide or silicon nitride, or combinations of both, and the upper of the two layers is doped or undoped polysilicon. Together, the two layers are patterned in a first etch step to form a trench mask for subsequent etching of trenches in the substrate. The upper layer is deposited to a thickness "t" related to the desired depth "d" of the trenches to be etched. In a second etch step, the trenches are formed in the substrate. In the case of substantially uniform etching of the polysilicon and the substrate, the thickness of the polysilicon is substantially equal to the desired trench depth. In the case of unequal etching of the polysilicon and the substrate, the thickness of the polysilicon is based on the etch rate disparity. In either case, trench etch endpoint detection is provided by clearing of the polysilicon and consequent exposure of the lower layer of the trench mask. In both cases, loading effects during the second etch step are alleviated, or completely eliminated, because both the upper layer and the substrate are silicon-based materials.

16 Claims, 2 Drawing Sheets

U.S. PATENT DOCUMENTS

| | | | |
|---|---|---|---|
| 4,879,257 | 11/1989 | Patrick | 437/195 |
| 4,879,258 | 11/1989 | Fisher | 437/225 |
| 4,892,614 | 1/1990 | Chapman et al. | 156/643 |
| 4,892,845 | 1/1990 | Bridges | 437/195 |
| 4,894,351 | 1/1990 | Batty | 437/190 |
| 4,897,150 | 1/1990 | Dooley et al. | 156/628 |
| 4,897,364 | 1/1990 | Nguyen et al. | 437/69 |
| 4,897,365 | 1/1990 | Baldi et al. | 437/69 |
| 4,898,841 | 2/1990 | Ho | 437/200 |
| 4,900,689 | 2/1990 | Bajor et al. | 437/31 |
| 4,901,132 | 2/1990 | Kuwano | 357/43 |
| 4,902,641 | 2/1990 | Koury, Jr. | 437/62 |
| 4,903,109 | 2/1990 | Kooi | 357/50 |
| 4,903,112 | 2/1990 | Strack et al. | 357/55 |
| 4,905,062 | 2/1990 | Esquivel et al. | 357/23.5 |
| 4,905,073 | 2/1990 | Chen et al. | 357/67 |
| 4,906,592 | 3/1990 | Merenda et al. | 437/190 |
| 4,906,593 | 3/1990 | Shioya et al. | 437/192 |
| 4,906,595 | 3/1990 | van der Plas et al. | 437/239 |
| 4,907,063 | 3/1990 | Okada et al. | 357/54 |
| 4,907,066 | 3/1990 | Thomas et al. | 357/71 |
| 4,908,683 | 3/1990 | Matlock et al. | 357/23.11 |
| 4,910,155 | 3/1990 | Cote et al. | 437/8 |
| 4,910,168 | 3/1990 | Tsai | 437/193 |
| 4,912,062 | 3/1990 | Verma | 437/69 |
| 4,914,056 | 4/1990 | Okumura | 437/192 |
| 4,916,087 | 4/1990 | Tateoka et al. | 437/67 |
| 4,916,494 | 4/1990 | Flohrs et al. | 357/13 |
| 4,916,514 | 4/1990 | Nowak | 357/68 |
| 4,918,510 | 4/1990 | Pfiester | 357/42 |
| 4,920,070 | 4/1990 | Mukai | 437/173 |
| 4,920,401 | 4/1990 | Sakai et al. | 357/59 |
| 4,924,284 | 5/1990 | Beyer et al. | 357/49 |
| 4,927,780 | 5/1990 | Roth et al. | 437/69 |
| 4,929,996 | 5/1990 | Hutter | 357/34 |
| 4,931,409 | 6/1990 | Nakajima et al. | 437/63 |
| 4,933,303 | 6/1990 | Mo | 437/190 |
| 4,935,095 | 6/1990 | Lehrer | 156/644 |
| 4,935,378 | 6/1990 | Mori | 437/43 |
| 4,935,804 | 6/1990 | Ito et al. | 357/71 |
| 4,939,105 | 7/1990 | Langley | 437/228 |
| 4,940,507 | 7/1990 | Harbarger | 156/636 |
| 4,942,137 | 7/1990 | Sivan et al. | 437/63 |
| 4,944,836 | 7/1990 | Beyer et al. | 156/645 |
| 4,946,550 | 8/1990 | Van Laarhoven | 156/643 |
| 4,946,800 | 8/1990 | Li | 437/65 |
| 4,948,742 | 8/1990 | Nishimura et al. | 437/24 |
| 4,950,617 | 8/1990 | Kumagai et al. | 437/41 |
| 4,952,274 | 8/1990 | Abraham | 156/643 |
| 4,952,524 | 8/1990 | Lee et al. | 437/67 |
| 4,952,525 | 8/1990 | van der Plas | 437/69 |
| 4,954,214 | 9/1990 | Ho | 156/628 |
| 4,954,458 | 9/1990 | Reid | 437/51 |
| 4,954,459 | 9/1990 | Avanzino et al. | 437/228 |
| 4,956,313 | 9/1990 | Cote et al. | 437/203 |
| 4,956,314 | 9/1990 | Tam et al. | 437/241 |
| 4,957,873 | 9/1990 | Ojha et al. | 437/20 |
| 4,959,325 | 9/1990 | Lee et al. | 437/30 |
| 4,963,951 | 10/1990 | Alder et al. | 357/23.7 |
| 4,966,861 | 10/1990 | Mieno et al. | 437/99 |
| 4,980,019 | 12/1990 | Baerg et al. | 156/643 |
| 4,980,311 | 12/1990 | Namose | 437/67 |
| 4,985,740 | 1/1991 | Shenai et al. | 257/384 |
| 5,006,482 | 4/1991 | Kerbaugh et al. | 437/67 |
| 5,011,788 | 4/1991 | Kawaji et al. | 437/67 |
| 5,015,602 | 5/1991 | Van Der Plas et al. | 437/67 |
| 5,069,002 | 12/1991 | Sandhu et al. | 51/165 R |
| 5,091,289 | 2/1992 | Cronin et al. | 430/312 |
| 5,091,330 | 2/1992 | Cambou et al. | 437/62 |
| 5,094,972 | 3/1992 | Pierce et al. | 437/67 |
| 5,102,822 | 4/1992 | Calligaro | 437/67 |
| 5,104,482 | 4/1992 | Monkowski et al. | 156/643 |
| 5,139,904 | 8/1992 | Auda et al. | 430/30 |
| 5,142,828 | 9/1992 | Curry, II | 51/281 |
| 5,214,001 | 5/1993 | Ipposhi et al. | 437/228 |
| 5,242,536 | 9/1993 | Schoenborn | 156/643 |

FOREIGN PATENT DOCUMENTS

| | | |
|---|---|---|
| 0375632A2 | 6/1990 | European Pat. Off. |
| 58-67023 | 4/1983 | Japan |
| 58-153351 | 9/1983 | Japan |
| 59-108325A | 6/1984 | Japan |
| 61-137344 | 6/1986 | Japan |
| 0120028 | 6/1987 | Japan |
| 62-125629A | 6/1987 | Japan |
| 63-16637 | 1/1988 | Japan |
| 1-235245A | 9/1989 | Japan |
| 3-151635A | 6/1991 | Japan |
| 2186424 | 8/1987 | United Kingdom |
| WO90/00476 | 1/1990 | WIPO |

OTHER PUBLICATIONS

"Thin Film Process"; Vossen et al; pp. 497–521; 1987.

"Chemical Vapor Deposited Device Isolation With Chemical/Mechanical Planarization", IBM Technical Disclosure Bulletin, vol. 29, No. 2, Jul. 1986, pp. 577–579.

*Glass Planarization By Stop-Layer Polishing*, Beyer, Mendel, Plikin, Riseman, 1985, IBM TDB, vol. 27 No. 8, pp. 4700–4701. pp. 577–579.

*Trench Planarization Technique*, C. W. Koburger, 1984, IBM (TDB), vol. 27 No. 6, pp. 3242–32433.

SHALLOW TRENCH ETCH

CROSS-REFERENCE TO RELATED APPLICATIONS

This application is a continuation of application Ser. No. 07/779,838, filed on Jun. 24, 1991, now abandoned, which is a continuation-in-part of commonly-owned U.S. patent application No. 07/711,624, now U.S. Pat. No. 5,290,396, entitled TRENCH PLANARIZATION TECHNIQUES and filed on Jun. 06, 1991 by Pasch and Schoenborn, which is a continuation-in-part of commonly-owned U.S. patent application No. 07/632,461, now U.S. Pat. No. 5,242,536, entitled ANISOTROPIC POLYSILICON ETCHING PROCESS and filed on Dec. 20, 1990 by Schoenborn.

TECHNICAL FIELD OF THE INVENTION

The present invention relates to the fabrication of semiconductor devices and, more particularly, to techniques for forming trenches, such as for isolation structures.

BACKGROUND OF THE INVENTION

Electrical isolation of semiconductor integrated transistors from one another can be achieved by laterally (in the plane of the wafer) isolating "active" regions of the device with insulating material. Two techniques are common: 1) selectively oxidizing wafer silicon surrounding the active region by means of Low Temperature Oxidation (LTO), Local Oxidation of Silicon (LOCOS), or the like, or 2) depositing insulating material, such as silicon dioxide in trenches formed around the active regions.

Regarding the latter technique (trench formation and filling), trenches are typically etched (e.g. plasma etched) into the substrate around the active regions to a depth "d" of from a few hundred Angstroms (Å) to a few microns ($\mu$m). A patterned mask, such as silicon dioxide or silicon nitride, is used for etching the trenches, and an etchant such as fluorine and/or chlorine containing gases, are normally used for etching the substrate selectively (preferentially) to the mask material. Commonly, the resulting trenches are overfilled with silicon dioxide ("oxide"), and excess oxide (that which is not within the trench) is removed, such as by polishing—as disclosed in commonly-owned, copending U.S. patent application No. 07/711,624, entitled TRENCH PLANARIZATION TECHNIQUES, and filed on Jun. 06, 1991 by Schoenborn and Pasch.

FIG. 1 shows a semiconductor device 110, including a substrate 112, an etched trench 114 of width "w" and depth "d" adjacent (surrounding) diffusion regions 116, and a mask layer 118 having an opening 120 for allowing etchants 122 to form the trench 114. Ultimately, the trench will be filled with an insulating material, and will form an isolation structure.

The mask 118 can be composed of several layers. In the case of the top layer of the mask 118 being nitride, the bottom layer would be a stress-reducing buffer oxide. The important factor is that layer(s) 118 be designed such that it protects the substrate during trench etch and fulfills subsequent requirements, such as acting as a polish stop layer if a uniform trench-fill insulating material is further planarized by mechanical polishing.

The technique illustrated in FIG. 1 is commonly employed, but does not provide a suitable mechanism for endpoint detection. Therefore, in order to form trenches of equal depth, from wafer-to-wafer (e.g., using a single wafer etcher), or from batch-to-batch (e.g., using a batch reactor), etch rate must be very well controlled, and usually must be measured immediately prior to etching.

Furthermore, in the case of trenches having different sizes (widths), loading effects are uneven and the various size trenches will not etch to the same depth. (Etching to the same depth is generally preferred from the viewpoint of device performance consistency and quality of manufacturing.) For a common range of trench widths, ranging from 10 $\mu$m to 1 mm, resulting etch depth can vary widely, which is undesirable as it is a difficult effect to control.

Additionally, while trench depth can be measured with a stylus, such a measuring technique is both slow and destructive.

What is needed is a technique for self-controlling trench etch depth.

DISCLOSURE OF THE INVENTION

It is therefore an object of the present invention to provide an improved technique for etching trenches, particularly shallow isolation trenches (e.g., less than 1 $\mu$m deep) in semiconductor devices.

It is another object of the present invention to provide a built-in endpoint detection mechanism in the trench etching process.

It is another object of the present invention to provide a technique for etching trenches which alleviates loading problems associated with etching trenches of different sizes (widths).

According to the invention, two dissimilar layers of material are deposited over a substrate, and together they are patterned in a first etch step to form a trench mask for subsequent etching of trenches in the substrate. The lower layer is an insulating layer such as silicon dioxide or silicon nitride, and the upper layer is a layer of undoped polysilicon deposited to a thickness "t" related to the desired depth "d" of the trenches.

As in the prior art, the nitride (e.g., lower) layer may be a composite layer of nitride and stress-reducing buffer oxide. Hereinafter, this layer is simply referred to as a "mask" layer.

In a second etch step ("trench etch"), the trenches are formed in the substrate. In the case of substantially uniform etching of the polysilicon and the substrate, the thickness of the polysilicon is substantially equal to the desired trench depth. In the case of unequal etch rates between the polysilicon and the substrate, the thickness of the polysilicon is based on the etch rate disparity. In either case, trench etch endpoint detection is provided by clearing of the polysilicon and consequent exposure of the first mask layer. In both cases, loading effects during the silicon trench etch step are alleviated, or completely eliminated, because both the top layer and the substrate are silicon-based materials.

By using the technique of the present invention, manufacturability of semiconductor devices is improved. Resulting trench depth will be more uniform and predictable. Hence, process "uptime" can be significantly increased, and a reduction in failures will be experienced.

Other objects, features and advantages of the invention will become apparent in light of the following description thereof.

It should be understood that while only one semiconductor structure is shown, the present invention is applicable to a plurality of such structures on a semiconductor device.

DETAILED DESCRIPTION OF THE INVENTION

Figure 1:
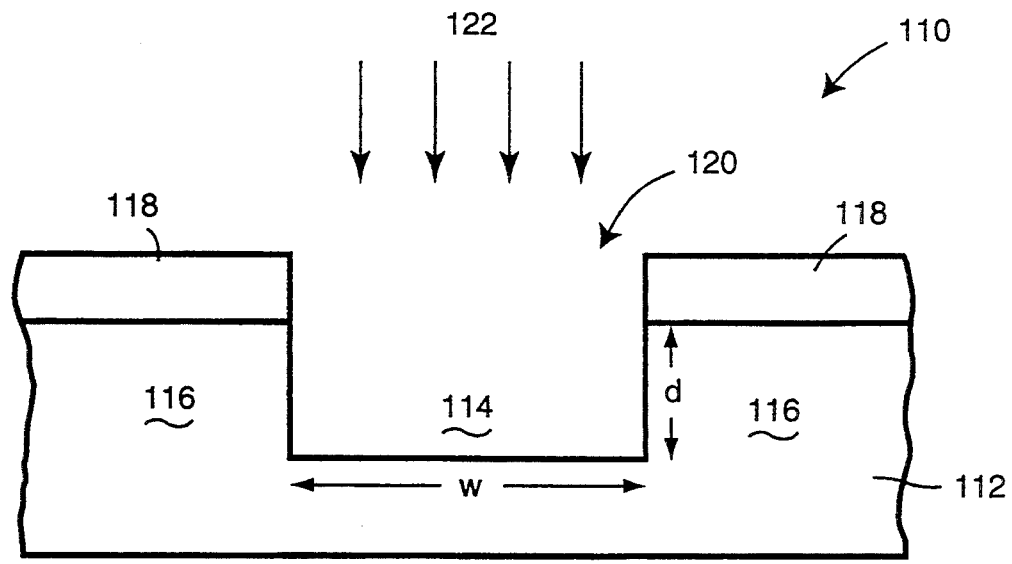
FIG. 1 is a cross-sectional view of a prior art semiconductor structure, illustrating the process of etching trenches for isolation structures.

FIG. 1 shows a semiconductor trench structure and trench etching technique of the prior art, and has been discussed hereinabove.

Figure 2A:
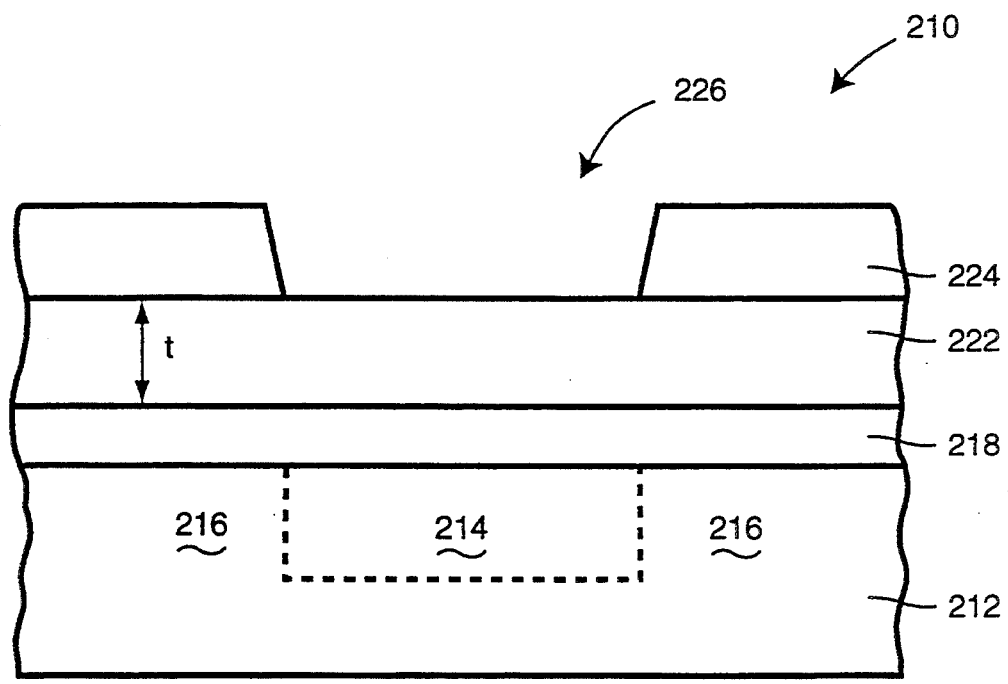
FIG. 2A is a cross-sectional view of a semiconductor structure, formed according to the present invention, prior to trench etching.

FIG. 2A shows an in-process semiconductor structure 210, according to the present invention. The structure 210 includes a substrate 212, including within the substrate an area 214 (within the dashed lines) in which an isolation trench will be formed adjacent diffusion regions (active areas) 216.

A single or multi-layer layer of insulating materials 218, selected from the group of silicon dioxide ("oxide") and silicon nitride, is deposited without patterning over the substrate. As in the prior art, the layer 218 will eventually become patterned, with openings (220 with respect to FIG. 2B) for allowing etching of trenches through the openings. Hence, the material 218 is suitably a common trench etch mask material, and is suitably deposited to a thickness comparable to that in the prior art (e.g., approximately 1000 Å). The layer 218 is hereinafter referred to as a "mask" layer (since it will eventually be etched).

As in the prior art, the mask layer 218 may be composed of several layers, for example a layer of nitride over a stress-reducing buffer oxide.

A non-patterned layer of undoped polysilicon 222 is deposited over the mask layer 218, to a thickness "t". The thickness "t" is established to be related, and preferably substantially equal to the ultimate depth "d" of the trench 214' to be formed (see FIG. 2C).

A patterned layer of photoresist 224 is deposited over the polysilicon layer 222, and has openings 226 directly over the areas 214 where trenches are to be formed.

The structure 210 of FIG. 2A is now etched to create openings 220 (one opening 220 shown) through the polysilicon and mask layers directly over the inchoate isolation trench area 214. A suitable recipe for plasma etching through the polysilicon and mask layer is a chlorine-based anisotropic polysilicon etch process which may contain hydrogen bromide (HBr), while a fluorocarbon-based anisotropic oxide/nitride etch would be suitable in defining the mask layer.

Etching with HBr is disclosed in copending, commonly-owned U.S. patent application No. 632,461, entitled ANISOTROPIC POLYSILICON ETCHING PROCESS and filed on Dec. 20, 1990 by Schoenborn, the disclosure of which is incorporated by reference herein.

Generally, the first etching step proceeds until silicon (substrate 212) is exposed, and this endpoint is suitably detected by observing the appearance of silicon from the substrate 212 in the etching environment and/or observing the appearance and subsequent disappearance of material from the mask layer 218 in the etching environment. In either case, etching in the first step continues until the substrate 212 becomes exposed.

Preferably, etching of the single or multi-layer 218 proceeds in one or several steps until silicon (substrate 212) is exposed. In the case of the layer 218 being composed of nitride on top of a thin (<500 Å) oxide, the oxide may be stripped (etched) by wet chemicals such as HF, which has a high selectivity to both silicon and nitride while leaving an undamaged silicon surface 212 prior to trench etch.

Figure 2B:
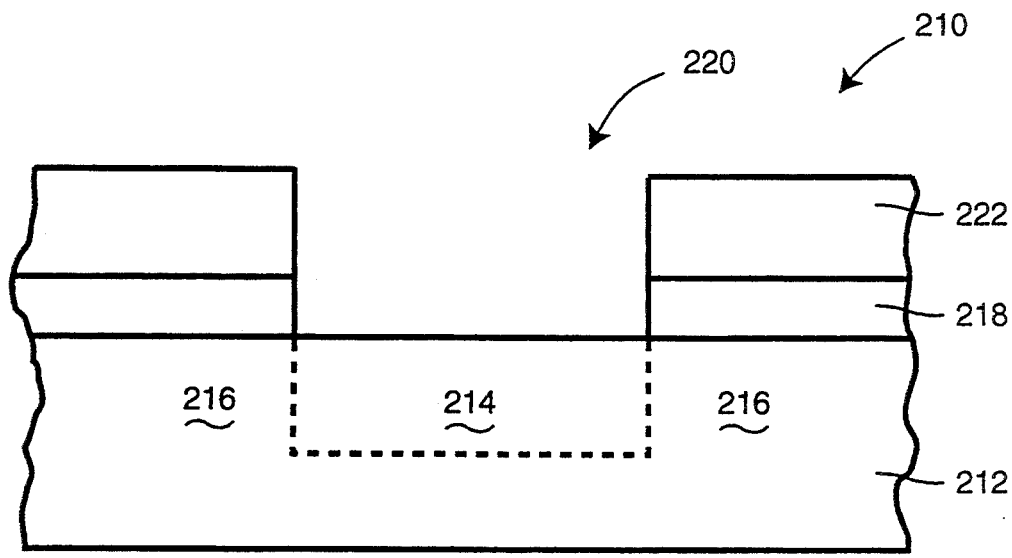
FIG. 2B is a cross-sectional view of the semiconductor structure of FIG. 2A, at a later stage in fabrication, after a first etch step and prior to the trench etch step, according to the present invention.
Figure 2C:
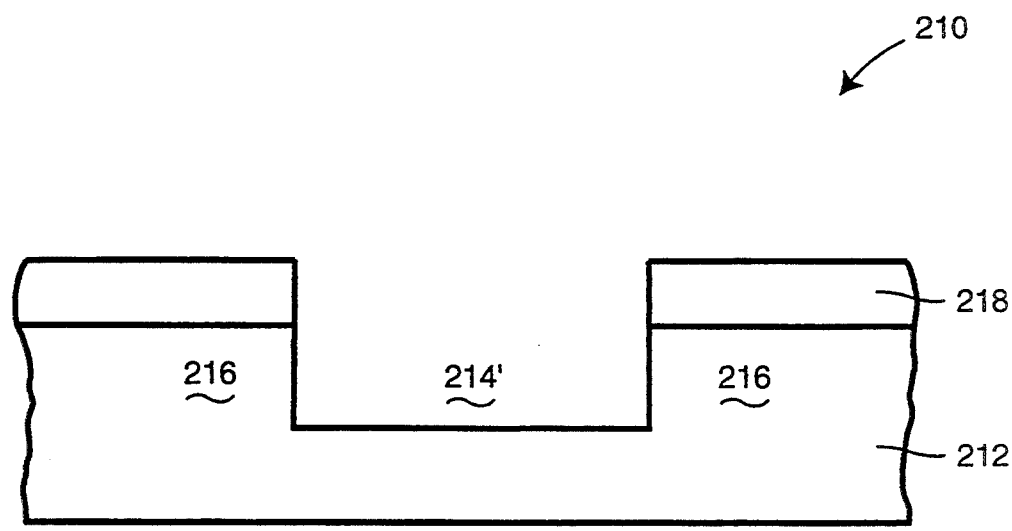
FIG. 2C is a cross-sectional view of the semiconductor structure of FIG. 2B, at a yet later stage in fabrication, after the trench etch step wherein a trench is formed, such as for an isolation structure, according to the present invention. At this point, any suitable trench-filling technique can be employed to fill the resulting trench.

The photoresist 224 is then stripped away, using known techniques, and the resulting Structure is illustrated in FIG. 2B.

FIG. 2B shows the semiconductor device 210 of FIG. 2A, after the first etch step and resist strip. As mentioned hereinbefore, holes 220 through the polysilicon and mask layers are formed over the areas 214 in the substrate 212 that are to become trenches for subsequent filling with isolation material (oxide).

Holes 220 having been formed through the polysilicon and mask layers, together they may be considered to be a two-layer "trench mask" (as distinguished from the terminology "mask layer" used to reference the layer 218). The device 210 is now subjected to a second etch step. In this step, the areas 214 are etched to a depth "d", and will become trenches 214', such as isolation trenches filled with oxide. (The process of filling isolation trenches is known.) As noted above, the thickness "t" of the polysilicon layer 222 is related to (a function of) the desired trench depth "d".

Advantageously, in the trench (second) etch step, the entire surface being etched is silicon-based material—native silicon in the case of the substrate 212, and deposited polysilicon in the case of the layer 222. Hence, loading effects are substantially alleviated (in some cases, to zero). This is in marked contrast to the techniques of the prior art (see FIG. 1), where loading effects can be profoundly manifest and troublesome.

The loading effect is well described by Mogab (C. J. Mogab, "The Loading Effect in Plasma Etching", J. Electrochem. Soc., 124, 1262 (1977)), and can manifest itself not only at the wafer scale but also at a microscopic level whereby the etch rate at a particular location on the wafer or within a device depends on local properties of the surface, such as exposed area, or proximity of a narrow trench to wide open trenches as opposed to having a regular pattern made of features with similar geometries. On the wafer scale, a loading effect may result in dissimilar trench depths depending on products with different trench isolation areas.

Further, a built-in endpoint detection mechanism is provided in the trench (second) etch step. Since etching is intended to proceed until the polysilicon layer 222 is substantially removed (cleared), when this occurs the mask layer 218 will become exposed, slightly etched, and detected in the etching environment.

A suitable recipe for plasma etching in the trench etch step is a chlorine-based anisotropic polysilicon etch process which may contain hydrogen bromide. Reference is again made to U.S. patent application No. 632,461. This recipe will etch the polysilicon 222 and wafer 212 substantially uniformly. Hence, with substantially similar etch rates for the polysilicon 222 and wafer 212, the thickness "t" of the polysilicon layer 222 would be established to be substantially equal to the desired trench depth "d". In the case where the polysilicon and wafer etch at dissimilar rates (and these rates are readily determined), the thickness "t" of the polysilicon layer can be established as a simple multiple of the desired trench depth "d"—in other words, as a function of the etch rate disparity. To the effect of forming a trench of depth "d" at the time when the layer 222 is substantially removed from the wafer, the polysilicon 222 may be doped so as to adjust its etch rate with respect to the silicon 212. In either case, the target is continuing etching (in the trench etch step) until the polysilicon is substantially etched away—resulting in the etching of trenches of a desired depth.

In all (first and second/trench) etch steps, etching is continued until a material dissimilar from that being etched becomes exposed. As mentioned hereinabove, this phenomenon is readily observable. Various techniques for detecting the appearance of a dissimilar substance in the etching environment are known, and include optical techniques such as collecting the plasma emission intensity at a particular wavelength and monitoring its change at endpoint, and other techniques such as monitoring a particular gaseous species by mass-spectrometry, the concentration of which changes at endpoint.

As mentioned hereinabove, various techniques are known for subsequently filling the trenches, which in the case of the isolation trenches discussed herein, would be a subsequent step in device fabrication. (There may be other steps in-between, which do not affect the mechanical structure, such as implant, trench oxidation, etc.) Specific reference is made to the techniques for filling and planarizing isolation trenches disclosed in commonly-owned, copending U.S. patent application No. 07/711,624, entitled TRENCH PLANARIZATION TECHNIQUES and filed on Jun. 06, 1991 by Pasch and Schoenborn, incorporated by reference herein.

The techniques for constructing trenches disclosed herein are also applicable to devices based on gallium arsenide (GaAs) as opposed to silicon. For example, in the formation of silicon-based microsensors (micromachining), a multi-layer trench mask (e.g., deposited oxide on polysilicon) could be applied over an "initial" layer of oxide wherein the oxide should not be etched down to the silicon substrate. Again, it is preferable that the materials for the two layers of the two-layer trench mask be selected so that the top layer of the trench mask etches substantially uniformly with the initial layer, and the bottom layer of the trench mask is a dissimilar material providing convenient endpoint detection for the second etch step.

What is claimed is:

1. A method of forming isolation trenches adjacent active areas in semiconductor devices, consisting of essentially:

applying a first non-patterned layer of a first material over a substrate;

applying a second non-patterned layer of a second material, dissimilar from the first material, over the first non-patterned layer;

in a first etching step, etching holes through the first and second non-patterned layers directly atop selected areas in the substrate, and exposing a surface of the substrate underlying the first layer, said first etching step being conducted as an anisotropic plasma etch employing a chlorine containing gas and hydrogen bromide;

in a second, subsequent etching step, etching the second layer and the substrate until the first layer is exposed, thereby forming trenches in the substrate;

wherein:

the second layer is applied to a thickness "t" which is a multiple, based on the disparity of the etching rates of the second layer and the substrate, of a desired trench depth "d", and wherein "d" is at most about 1 micrometer.

2. A method according to claim 1, wherein:
the first layer is a single or multi-layer of materials selected from the group of silicon dioxide and silicon nitride.

3. A method according to claim 1, wherein:
the second layer is polysilicon.

4. A method according to claim 1 wherein:
the second layer etches substantially uniformly with the substrate; and
the thickness "t" of the second layer is substantially equal to the desired trench depth "d".

5. A method according to claim 1, wherein:
the second etching step is a chlorine-based anisotropic polysilicon etch process which contains hydrogen bromide.

6. A method according to claim 1 wherein:
the first etching step is continued until the substrate become exposed.

7. A method according to claim 1, wherein:
both the second layer and the substrate are silicon-based materials; and
loading effects in the second etching step are thereby alleviated.

8. A method according to claim 1, wherein:
the first layer is a multi-layer of thin oxide under nitride.

9. A method, according to claim 1, wherein:
the thickness of the second layer is a multiple of the depth of the trench.

10. A method, according to claim 1, wherein:
the second layer is doped to etch at the same rate as the substrate.

11. A method, according to claim 1, wherein:
in the first etching step, etching is performed in a plasma etcher, and the plasma has a total flow of He, HBr and Cl— containing gases, as follows:
the percent of He flow in the total flow is within 0–30% of the total flow;
the balance of the total flow is HBr and any chlorine-containing gas such as $Cl_2$, $BCl_3$, and HCl; and
the percent of He flow in the balance of the total flow is within 30–50%; and wherein:
the etcher has a discharge gap "g" and a plasma pressure "p";
the plasma flow has a residence time, and an electrical field having a discharge power is deposited in the plasma;

the product of the gap ("g", in cm) times the pressure ("p", in mTorr) divided by the total gas flow ("F", in sccm) related to the residence time is between 0.5 and 1.2; and the ratio of square root of the power deposited in the plasma ("W", in watts) by the pressure "p", or $W^{\frac{1}{2}}/p$, related to the ratio of the electrical field ("E") to the pressure (E/p) is within 0.046 to 0.070.

12. A method, according to claim 1, wherein:

in the second etching step, etching is performed in a plasma etcher, and the plasma has a total flow of He, HBr and Cl— containing gases, as follows:

the percent of He flow in the total flow is within 0–30% of the total flow;

the balance of the total flow is HBr and any chlorine-containing gases such as $Cl_2$, $BCl_3$, and HCl; and the percent of HBr flow in the balance of the total flow is weithin 30–50%; and wherein:

the etcher has a discharge gap "g" and a plasma pressure "p";

the plasma flow has a residence time, and an electrical field having a discharge power is deposited in the plasma;

the product of the gap ("g", in cm) times the pressure ("p", in mTorr) divided by the total gas flow ("F", in sccm) related to the residence time is between 0.5 and 1.2; and the ratio of the square root of the power deposited in the plasma ("W", in watts) by the pressure "p", or $W^{\frac{1}{2}}/p$ related to the ratio of the electrical field ("E") to the pressure (E/p) is within 0.046 to 0.070.

13. A method, according to claim 1, wherein:

the second layer etches at a lower rate than the substrate.

14. A method, according to claim 1, wherein:

the second layer etches at a higher rate than the substrate.

15. A method according to claim 1 wherein the etch rate of the second layer may be adjusted by the varying the doping level of the second layer.

16. A method according to claim 1 wherein trenches are formed in substrates comprising GaAs.

* * * * *